(12) United States Patent
Kang et al.

(10) Patent No.: US 9,979,412 B2
(45) Date of Patent: May 22, 2018

(54) ENCODER RESOLUTION REDUCTION

(71) Applicant: OTIS ELEVATOR COMPANY, Farmington, CT (US)

(72) Inventors: Keunmo Kang, South Windsor, CT (US); Slade Culp, Coventry, CT (US); Craig Drew Bogli, Avon, CT (US); William A. Veronesi, Hartford, CT (US); Daryl J. Marvin, Farmington, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 342 days.

(21) Appl. No.: 14/760,897

(22) PCT Filed: Jan. 18, 2013

(86) PCT No.: PCT/US2013/022079
§ 371 (c)(1),
(2) Date: Jul. 14, 2015

(87) PCT Pub. No.: WO2014/113015
PCT Pub. Date: Jul. 24, 2014

(65) Prior Publication Data
US 2015/0365103 A1   Dec. 17, 2015

(51) Int. Cl.
*B66B 1/34* (2006.01)
*H03M 5/02* (2006.01)
(Continued)

(52) U.S. Cl.
CPC .............. *H03M 5/02* (2013.01); *B66B 1/3492* (2013.01); *G01D 5/347* (2013.01); *H03M 1/22* (2013.01);
(Continued)

(58) Field of Classification Search
CPC ........ H03M 5/02; H03M 1/22; H03M 7/3059; H03M 1/303; B66B 1/3492; G01D 5/347
(Continued)

(56) References Cited

U.S. PATENT DOCUMENTS 5,021,781 A * 6/1991 Salazar ................ G05B 19/231
                                                         318/561
5,130,710 A * 7/1992 Salazar ............ G07B 17/00508
                                                         341/11
(Continued)

FOREIGN PATENT DOCUMENTS

CN         2604262 Y     2/2004
CN       101046394 A    10/2007
(Continued)

OTHER PUBLICATIONS

International Search Report for application PCT/US2013/022079, dated Oct. 21, 2013, 3 pages.
(Continued)

*Primary Examiner* — Anthony Salata
(74) *Attorney, Agent, or Firm* — Cantor Colburn LLP

(57) ABSTRACT

One or more embodiments are directed to an encoder configured to output a signal, and a computing device configured to receive the signal from the encoder and generate a reduced resolution version of the signal, the computing device is configured to transmit the reduced resolution version of the signal to a recipient.

16 Claims, 4 Drawing Sheets

(51) Int. Cl.
*H03M 7/30* (2006.01)
*G01D 5/347* (2006.01)
*H03M 1/22* (2006.01)
*H03M 1/30* (2006.01)

(52) U.S. Cl.
CPC .......... *H03M 7/3059* (2013.01); *H03M 1/303* (2013.01)

(58) Field of Classification Search
USPC ...... 187/247, 391, 393; 250/231.13, 231.14; 73/1.08, 1.11, 1.37, 1.41, 1.45; 702/145, 702/147, 151; 324/76.39, 76.77, 76.78, 324/76.79, 76.82, 90, 144
See application file for complete search history.

(56) References Cited

U.S. PATENT DOCUMENTS

| | | | | |
|---|---|---|---|---|
| 5,274,203 | A * | 12/1993 | Skalski | B66B 1/3492 187/287 |
| 5,939,712 | A * | 8/1999 | Venugopal | H03M 1/308 250/214 PR |
| 6,407,683 | B1 * | 6/2002 | Dreibelbis | H03M 1/0626 318/560 |
| 6,704,683 | B1 * | 3/2004 | Hasser | G01P 3/481 324/165 |
| 6,756,582 | B2 * | 6/2004 | Stridsberg | G01D 5/24447 250/231.13 |
| 7,230,401 | B2 * | 6/2007 | Muroi | G05B 19/23 318/466 |
| 7,681,693 | B2 * | 3/2010 | Tegtmeier | B66B 1/30 187/288 |
| 8,330,098 | B2 * | 12/2012 | Thor | G01D 5/347 250/231.13 |
| 8,631,908 | B2 * | 1/2014 | Schroeder-Brumloop | B66B 5/027 187/290 |
| 8,772,705 | B2 * | 7/2014 | Rai | G01D 5/36 250/231.13 |
| 9,484,060 | B2 * | 11/2016 | Yamamoto | G11B 20/10 |
| 2003/0122937 | A1 | 7/2003 | Guarnera et al. | |
| 2008/0177501 | A1 | 7/2008 | Krause et al. | |
| 2008/0185233 | A1 | 8/2008 | Tegtmeier | |
| 2010/0303460 | A1 | 12/2010 | Hunter | |

FOREIGN PATENT DOCUMENTS

| | | |
|---|---|---|
| CN | 102602170 A | 7/2012 |
| CN | 102840874 A | 12/2012 |
| WO | 0192894 A2 | 12/2001 |

OTHER PUBLICATIONS

European Search Report for application 13872262.4, dated Jul. 12, 2016, 13 pages.
Hessmer, Rainer Dr., "Quadrature Encoder too Fast for Arduino (with Solution)", Jan. 20, 2011, Robotics, avavailable at www.hessmer.org/blog/2011/01/30, 24 pages.
Chinese First Office Action and Search Report for application CN 201380070666.8, dated Feb. 13, 2018, 18 pages.

* cited by examiner

US 9,979,412 B2

ENCODER RESOLUTION REDUCTION

BACKGROUND

In a given system or environment, the resolution of an encoder may need to be regulated or controlled. For example, rescue systems in elevators typically utilize a relatively low encoder resolution, such as nine (9) lines/revolution. More generally, a low encoder resolution may be needed when interfacing to a system, device, or component that cannot handle a high frequency.

Reflective encoders may use a resolution of approximately eight (8) lines/millimeter (if an encoder track is placed on, e.g., a 24.70 millimeter (mm) radius circle, then the resolution will be 1296 lines/revolution). Such a relatively high resolution might be incompatible with an interface requiring a low resolution.

BRIEF SUMMARY

An embodiment is directed to a method comprising receiving, by a device, two channels associated with an output of an encoder, executing, by the device, a first algorithm to detect a direction of movement of an entity the encoder is applied to based on the two channels, executing, by the device, a second algorithm to generate two channels with a reduced resolution relative to the two channels associated with the output of the encoder, the two channels with the reduced resolution comprising the detected direction of movement, and outputting, by the device, the two channels with the reduced resolution.

An embodiment is directed to a system comprising an encoder configured to output two channels, and a computing device configured to: receive the two channels output by the encoder, detect a direction of movement of an entity the encoder is applied to based on the two channels, generate two channels with a reduced resolution relative to the two channels associated with the output of the encoder, the two channels with the reduced resolution comprising the detected direction of movement, and output the two channels with the reduced resolution.

An embodiment is directed to an apparatus comprising at least one processor, and memory having instructions stored thereon that, when executed by the at least one processor, cause the apparatus to: receive two channels associated with an output of an encoder, execute a first algorithm to detect a direction of movement of an entity the encoder is applied to based on the two channels, execute a second algorithm to generate two channels with a reduced resolution relative to the two channels associated with the output of the encoder, the two channels with the reduced resolution comprising the detected direction of movement, and output the two channels with the reduced resolution.

An embodiment is directed to an apparatus comprising a decoder component configured to receive inputs that are in quadrature with one another, determine a direction of the inputs, and generate a pulse responsive to a transition in either of the inputs, a modulo counter component configured to be incremented responsive to the pulse when the direction of the inputs corresponds to a first direction and decremented responsive to the pulse when the direction of the inputs corresponds to a second direction, and a quadrature output component configured to divide a count output by the modulo counter into a plurality of segments and generate a pair of quadrature output signals.

An embodiment is directed to a system comprising an encoder configured to output a signal, and a computing device configured to receive the signal from the encoder and generate a reduced resolution version of the signal, the computing device is configured to transmit the reduced resolution version of the signal to a recipient.

Additional embodiments are described below.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
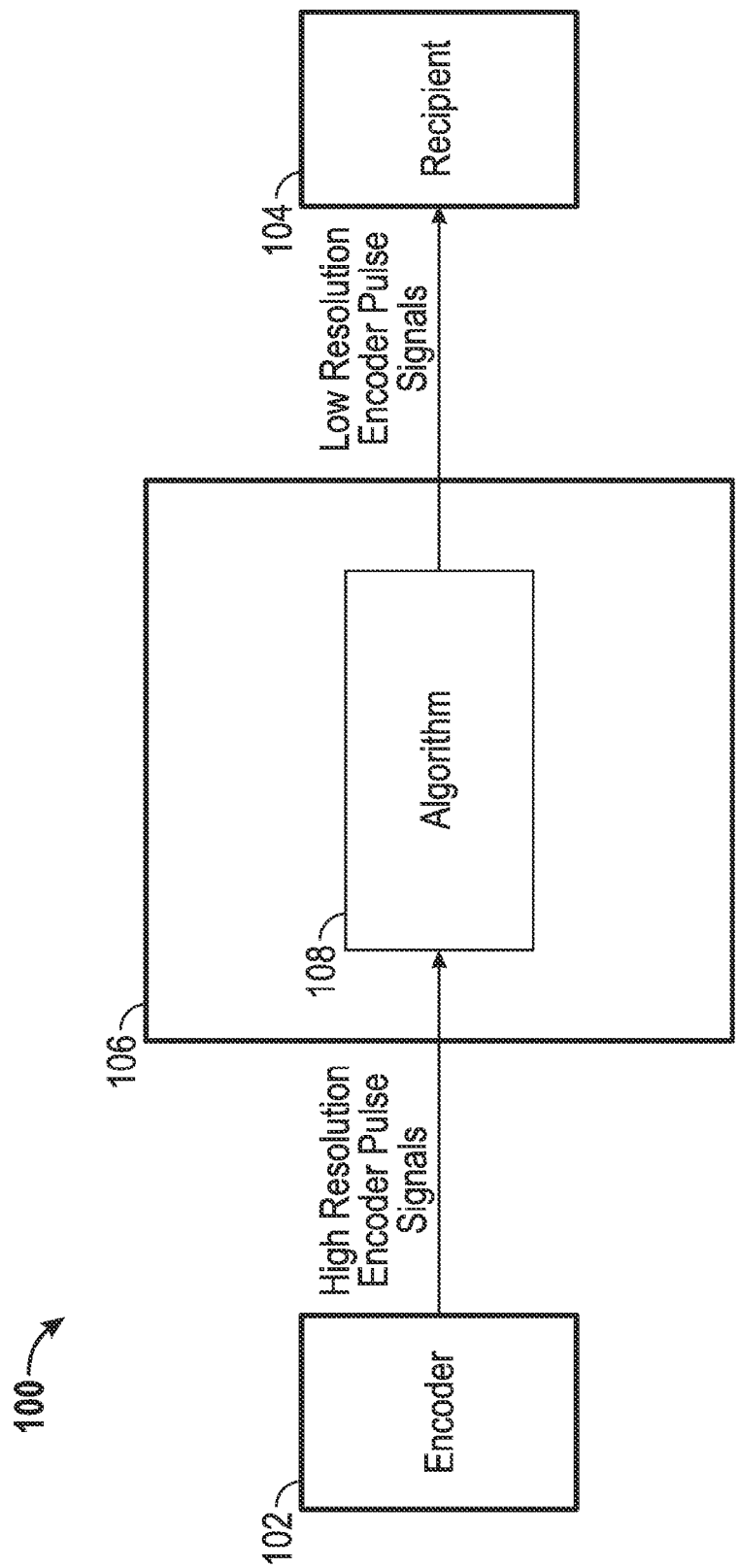
FIG. 1 illustrates an exemplary encoder resolution reduction system in accordance with one or more embodiments of the disclosure.

Exemplary embodiments of apparatuses, systems and methods are described for reducing a resolution of an encoder. In some embodiments, the reduction in resolution may be applied in one or more contexts or environments. For example, embodiments of the disclosure may be implemented in connection with rescue systems in elevators, redundant cross check or fault detection, or the acquisition of one or more signals from an encoder located a large distance away, where a length of the distance can be related to a frequency or pulse count of the signal(s). In some embodiments, an encoder resolution may be reduced so as to interface to a system, device, or component requiring a low encoder resolution.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection.

FIG. 1 illustrates an encoder resolution reduction system 100. In some embodiments, the system 100 may be included as a part of an elevator or elevator system.

The system 100 may include an encoder 102. In some embodiments, the encoder 102 may include a reflective encoder. The encoder 102 may generate and output one or more signals, such as pulsed signals. The signal(s) may be indicative of the operation of a device that the encoder 102 is associated with, such as a motor of an elevator.

In some embodiments, a signal output by the encoder 102 may be of a high resolution relative to a system, device, or component that is to be coupled to, or interface to, that output signal. For instance, a recipient 104 may include an input interface that might not be configured to accept a high frequency signal output by the encoder 102.

In some embodiments, in order to provide the output of the encoder 102 to the recipient 104, a device 106 may be used. The device 106 may include a computing device. The device 106 may be configured to reduce the resolution of a signal received from the encoder 102, and may generate and output a corresponding signal of a lower resolution.

In some embodiments, the device 106 may include an algorithm 108 that may be configured to reduce the resolution of the signal the device 106 receives from the encoder and output or transmit the reduced resolution signal. In some embodiments, the algorithm 108 may be implemented as, or include, a counter. The counter may be configured to output or generate a pulse every certain number of input counts. In some embodiments, the algorithm 108 may be implemented as, or include, a divide by 'N' process or routine.

In some embodiments, the device 106 may be implemented as, or include, one or more of a complex programmable logic device (CPLD), a field programmable gate array (FPGA), and a microprocessor/microcontroller. In some embodiments, such as those including at least one microprocessor, the device 106 may include memory having instructions stored thereon that, when executed by the at least one microprocessor, cause the device 106 to reduce a resolution of a signal received at the device 106, and output or transmit the reduced resolution signal. In some embodiments, logic or gates may be included in the device 106 to support the algorithm 108.

Figure 2:
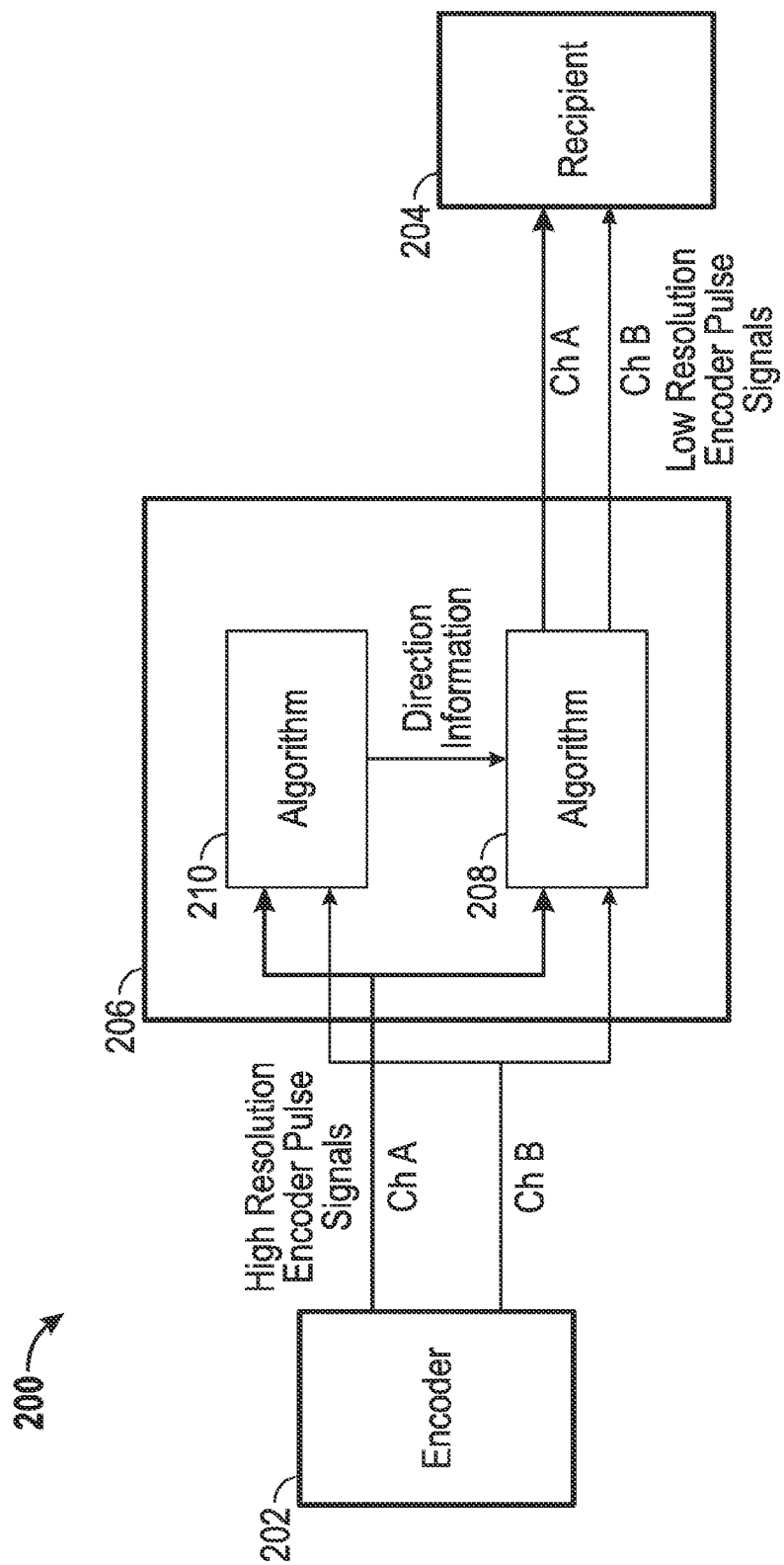
FIG. 2 illustrates an exemplary encoder resolution reduction system in accordance with one or more embodiments of the disclosure.

FIG. 2 illustrates an encoder resolution reduction system 200. In some embodiments, the system 200 may include one or more of an encoder 202, a recipient 204, a device 206, and an algorithm 208. The encoder 202 may correspond to, or be analogous to, the encoder 102 of FIG. 1. The recipient 204 may correspond to, or be analogous to, the recipient 104 of FIG. 1. The device 206 may correspond to, or be analogous to, the device 106 of FIG. 1. The algorithm 208 may correspond to, or be analogous to, the algorithm 108 of FIG. 1.

In some embodiments, the encoder 202 may generate and output two or more channels. In the exemplary system 200, the encoder is shown as outputting two channels, denoted as a first channel A and a second channel B.

The two channels A and B output by the encoder may be of a relatively high resolution compared to an input interface associated with the recipient 204. The device 206 may be configured to reduce the resolution of the signals associated with channels A and B output by the encoder 202. Such a reduction in resolution may be performed by the algorithm 208. The algorithm 208 may be configured to generate and output or transmit the reduced resolution signals corresponding to channels A and B.

In some embodiments, the encoder 202 may include, or be associated with, two code tracks with sectors positioned ninety (90) degrees out of phase or two encoders so aligned with a single code track as to produce two output channel signals 90 degrees out of phase during periods of constant motion. The two output channels A and B of the encoder 202 may be used to detect a direction of movement of an entity the encoder 202 is applied to, such as a rotating motor. For example, an algorithm 210 may be configured to perform such detection.

In some embodiments, the algorithm 210 may be configured to detect rising and/or falling edges of channels A and B output by the encoder 202, or voltage levels of channels A and B output by the encoder 202. Once detections of the channels are made, direction of movement may be made by applying logic. For example, a digital representation may be used, where a '0' may correspond to forward and a '1' may correspond to backward, or vice versa, so that the algorithm 208 may output quadrature outputs, potentially with a reduced resolution.

While shown as separate algorithms or components in FIG. 2, in some embodiments the algorithms 208 and 210 may be implemented in a common component.

Figure 3:
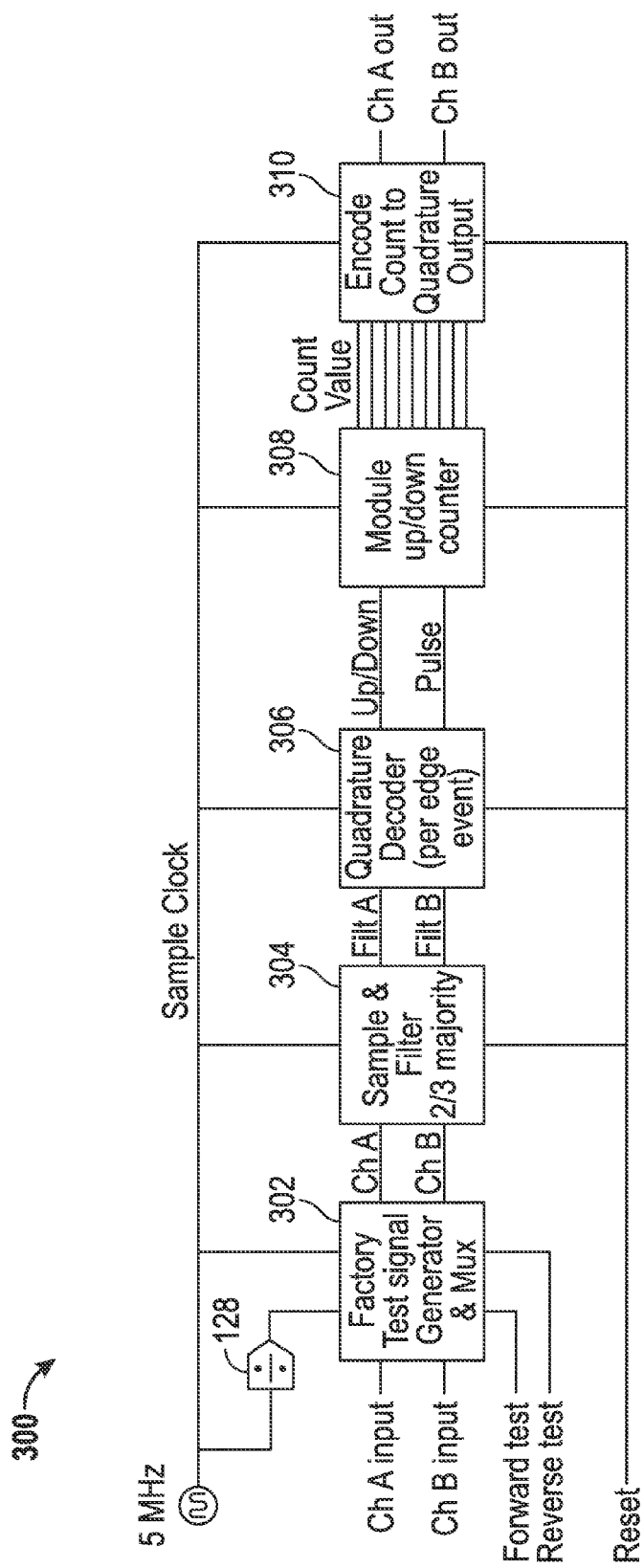
FIG. 3 illustrates an exemplary resolution reduction device in accordance with one or more embodiments of the disclosure.

FIG. 3 illustrates an exemplary resolution reduction device 300 for a dual channel (quadrature) encoder in accordance with one or more embodiments. In some embodiments, the device 300 may correspond to the device 206 of FIG. 2.

As shown, the device 300 may be associated with a number of signals. For example, a sample clock may correspond to a high frequency clock (e.g., 5 MHz) which may be used to synchronize two or more components (e.g., components 302, 304, 306, 308, and/or 310). Ch A input and Ch B input may correspond to optical encoder signals which may be in quadrature with one another. Ch A and Ch B may correspond to quadrature signals output by a factory test component 302. Filt A and Filt B may correspond to quadrature signals that are debounced or filtered to remove noise from the Ch A and Ch B signals. Up/Dwn may correspond to a signal that represents a direction of the quadrature pair (e.g., A and B, as reflected in Filt A and Filt B). Pulse may correspond to a signal that represents when a transition occurred on either of the Filt A and Filt B signals. Count value may correspond to, e.g., a nine (9) bit count value that represents the output of a modular or circular counter component 308. Ch A out and Ch B out may correspond to an encoded quadrature output of the counter component 308. A Reset signal may configure the components and signals in accordance with an initial or known state.

The factory test component 302 may be configured to generate simulated versions of the Ch A input and Ch B input signals. The output generated by the factory test component 302 may be based on the state of Forward test and Reverse test signals. The simulated versions of the Ch A input and Ch B input signals generated by the factory test component 302 may be based on a slower clock frequency than the sample clock. For example, the slower clock frequency may be obtained by dividing the sample clock by, e.g., one-hundred twenty-eight (128) as shown in FIG. 3. In some embodiments, the Ch A and Ch B signals output by the factory test component 302 may be a function of one or more test pins or test inputs (e.g., the Forward test and Reverse test signals), such that the factory test component 302 may be configured to pass the Ch A input and Ch B input signals to the sample and filter component 304 under one or more conditions. In some embodiments, the factory test component 302 may include one or more multiplexors to selectively choose between passing the Ch A input and Ch B input signals versus outputting a simulated signal. In some embodiments, the factory test component 302 may be used to test subsequent components, such as the components 304-310.

A sample and filter component 304 may be configured to sample the Ch A and Ch B signals and output respective Filt A and Filt B signals. In some embodiments, the Ch A and Ch B signals received at the sample and filter component 304 may be asynchronous, and the sample and filter component 304 may sample those signals and synchronize them with a system clock or the sample clock. The sample and filter component 304 may filter glitches from the Ch A and Ch B signals. For example, the sample and filter component 304 may apply a two out of three (⅔) majority filter in some embodiments.

A quadrature decoder component 306 may be configured to determine a direction of the quadrature input (e.g., forward or reverse), potentially in response to each transition of either Ch A or Ch B (as reflected in Filt A and Filt B, respectively). The determined direction may be output by the quadrature decoder component 306 in connection with the Up/Dwn signal. The quadrature decoder component 306 may create a single pulse for each transition in connection with the Pulse signal, so that the counter component 308 can count the event.

The counter component 308 may be configured to either increment or decrement an associated counter for each pulse event. The determination of whether to increment or decrement may be based on the state of the Up/Dwn signal (e.g., Up=increment, Dwn=decrement). Since the pulse from the quadrature decoder component 306 may be based on each transition (e.g., rising and falling) for each signal (e.g., both Ch A and Ch B), the value of the counter may be four times the frequency of either channel input. In some embodiments, a resolution divider of, e.g., one-hundred eight (108) may be used, such that the counter may be configured as a modulo four-hundred thirty-two (432) counter (e.g., 108×4=432). The counter component 308 may be configured to output the value of the count in connection with the Count value signal(s).

An encode count to quadrature output component 310 may be configured to receive the Count value signal(s) and divide the count value into segments, such as four equal segments. The encode count to quadrature output component 310 may be configured to encode the quadrature outputs into, e.g., four states, potentially to ensure that the output signals will be a quadrature pair. An example of the sequence of states may correspond to: Ch A out/Ch B out: 0/0=>0/1=>1/1=>1/0=>back to 0/0. Other patterns or sequences may be used.

In some embodiments, the Count value signal(s) output by the counter component 308 might correspond to the Up/Dwn and Pulse signals.

Figure 4:
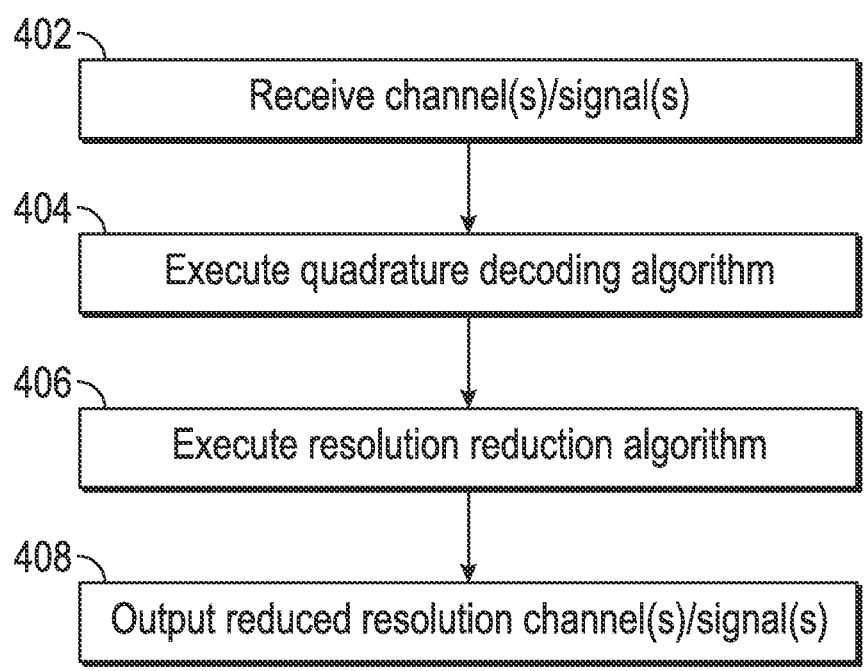
FIG. 4 illustrates an exemplary method of reducing a resolution of an encoder in accordance with one or more embodiments of the disclosure.

FIG. 4 illustrates a method that may be used in connection with one or more devices or systems, such as those described herein. The method of FIG. 4 may be used to generate and output one or more reduced resolution channels or signals.

In block 402, one or more channels or signals may be received. For example, a device (e.g., device 106 or device 206) may receive a channel or signal from an encoder (e.g., encoder 102 or encoder 202) at an input of the device. The received channel or signal may be of a high resolution, relative to a required for a low resolution channel or signal at an input interface associated with a recipient (e.g., recipient 104 or recipient 204).

In block 404, the device may execute a quadrature decoding algorithm (e.g., algorithm 210) to detect a direction of movement detect a direction of movement of an entity the encoder is applied to. The quadrature decoding algorithm may be based on a relative phase between two encoder pulse signals or channels (e.g., channels A and B as output by the encoder 202). As part of block 404, the quadrature decoding algorithm may output the detected direction of movement to another algorithm, such as a resolution reduction algorithm (e.g., algorithm 108 or algorithm 208).

In block 406, the device may execute a resolution reduction algorithm to reduce the resolution associated with the channel or signal received in block 402. As described above, the resolution reduction algorithm may be based on a counter or a divide by 'N' process or routine. In some embodiments, phasing may be maintained such that direction can be accurately inferred.

In block 408, the device may output the reduced resolution channel or signal, potentially for receipt by the recipient. The output reduced resolution channel or signal may include quadrature outputs with reduced resolution based on the direction information associated with block 404.

The method illustrated in connection with FIG. 4 is illustrative. In some embodiments, one or more of the blocks or operations (or portions thereof) may be optional. In some embodiments, the operations may execute in an order or sequence different from what is shown. In some embodiments, additional operations not shown may be included.

Embodiments of the disclosure may reduce a resolution associated with an output channel or signal of an encoder. In some embodiments, a high resolution encoder pulse channel or signal may be reduced in connection with one or more resolution reduction algorithms. Embodiments of the disclosure may achieve the reduction while minimizing cost. For example, some embodiments may leverage a low cost reflective encoder with high resolution in order to interface to a device that requires very low resolution encoder channels or signals.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein.

Embodiments may be tied to one or more particular machines. For example, one or more architectures or devices may be configured to reduce a resolution of an encoder, such as a reflective encoder. In some embodiments, the architectures or devices may maintain symmetry and quadrature data or information, which may be used to obtain information regarding a direction of movement.

Aspects of the disclosure have been described in terms of illustrative embodiments thereof. Numerous other embodiments, modifications and variations within the scope and spirit of the appended claims will occur to persons of ordinary skill in the art from a review of this disclosure. For example, one of ordinary skill in the art will appreciate that the steps described in conjunction with the illustrative figures may be performed in other than the recited order, and that one or more steps illustrated may be optional.

What is claimed is:
1. A method comprising:
   receiving, by a device, two channels associated with an output of an encoder;
   executing, by the device, a first algorithm to detect a direction of movement of an entity the encoder is applied to based on the two channels;
   executing, by the device, a second algorithm to generate two channels with a reduced resolution relative to the two channels associated with the output of the encoder, the two channels with the reduced resolution comprising the detected direction of movement; and outputting, by the device, the two channels with the reduced resolution.

2. The method of claim 1, wherein the second algorithm comprises a counter configured to output a pulse for each of the two channels with the reduced resolution based on having counted a number of input pulses in a corresponding one of the two channels associated with the output of the encoder.

3. The method of claim 1, wherein the first algorithm is configured to detect at least one of rising and falling edges in the two channels associated with the output of the encoder in detecting the direction of movement of the entity the encoder is applied to.

4. The method of claim 1, wherein the first algorithm is configured to detect voltage levels of the two channels associated with the output of the encoder in detecting the direction of movement of the entity the encoder is applied to.

5. The method of claim 1, wherein the entity the encoder is applied to comprises a rotating motor.

6. The method of claim 1, further comprising:

outputting, by the device, the two channels with the reduced resolution for receipt by an elevator rescue system.

7. A system comprising:

an encoder configured to output two channels; and a computing device configured to:
receive the two channels output by the encoder,
detect a direction of movement of an entity the encoder is applied to based on the two channels,
generate two channels with a reduced resolution relative to the two channels associated with the output of the encoder, the two channels with the reduced resolution comprising the detected direction of movement, and
output the two channels with the reduced resolution.

8. The system of claim 7, wherein the computing device comprises a counter configured to output a pulse for each of the two channels with the reduced resolution based on having counted a number of input pulses in a corresponding one of the two channels output by the encoder.

9. The system of claim 7, wherein the computing device is configured to detect at least one of rising and falling edges in the two channels output by the encoder in detecting the direction of movement of the entity the encoder is applied to.

10. The system of claim 7, wherein the computing device is configured to detect voltage levels in the two channels output by the encoder in detecting the direction of movement of the entity the encoder is applied to.

11. The system of claim 7, wherein the computing device comprises at least one of: a complex programmable logic device (CPLD), a field programmable gate array (FPGA), and a microprocessor/microcontroller.

12. The system of claim 7, wherein the encoder comprises a reflective encoder.

13. The system of claim 7, wherein the encoder and computing device are associated with at least one of an elevator and an elevator system.

14. The method of claim 1, wherein the device comprises:

a decoder component configured to receive inputs that are in quadrature with one another, determine a direction of the inputs, and generate a pulse responsive to a transition in either of the inputs;

a modulo counter component configured to be incremented responsive to the pulse when the direction of the inputs corresponds to a first direction and decremented responsive to the pulse when the direction of the inputs corresponds to a second direction; and a quadrature output component configured to divide a count output by the modulo counter into a plurality of segments and generate a pair of quadrature output signals.

15. The method of claim 14, wherein the device further comprises:

a filter component configured to filter glitches associated with the inputs; and a factory test component configured to selectively output as the inputs one of optical encoder inputs in quadrature with one another and simulated quadrature signals as a function of one or more test pins or test inputs.

16. The method of claim 15, wherein the decoder component, the modulo counter component, the quadrature output component, the filter component, and the factory test component are configured to be synchronized to one another via a clock, and wherein the factory test component is configured to generate the simulated quadrature signals based on a division of the clock.

* * * * *